United States Patent
Clark

(10) Patent No.: US 10,921,350 B2
(45) Date of Patent: Feb. 16, 2021

(54) VOLTAGE TESTING SYSTEM

(71) Applicant: Paul Clark, Katy, TX (US)

(72) Inventor: Paul Clark, Katy, TX (US)

(*) Notice: Subject to any disclaimer, the term of this patent is extended or adjusted under 35 U.S.C. 154(b) by 149 days.

(21) Appl. No.: 16/112,850

(22) Filed: Aug. 27, 2018

(65) Prior Publication Data
US 2019/0064229 A1 Feb. 28, 2019

Related U.S. Application Data

(60) Provisional application No. 62/552,858, filed on Aug. 31, 2017.

(51) Int. Cl.
*G01R 19/155* (2006.01)
*G01R 1/36* (2006.01)
*G01R 19/165* (2006.01)

(52) U.S. Cl.
CPC ............ *G01R 19/155* (2013.01); *G01R 1/36* (2013.01); *G01R 19/16561* (2013.01); *G01R 19/16595* (2013.01)

(58) Field of Classification Search
CPC ..... G01R 1/06788; G01R 1/36; G01R 19/155
See application file for complete search history.

(56) References Cited

U.S. PATENT DOCUMENTS

| | | | | |
|---|---|---|---|---|
| 2,790,051 A | * | 4/1957 | Sicho | G01R 1/06788 200/567 |
| 3,555,420 A | * | 1/1971 | Schwartz | G01R 19/14 324/149 |
| 3,577,208 A | * | 5/1971 | Petrick | G01R 1/06788 361/222 |
| 4,015,201 A | | 3/1977 | Chaffee | |
| 4,189,673 A | | 2/1980 | Shintaku | |
| 4,791,376 A | | 12/1988 | Freedman et al. | |
| 5,617,018 A | | 4/1997 | Earle | |
| 7,242,173 B2 | * | 7/2007 | Cavoretto | G01R 1/04 324/72.5 |
| 9,046,564 B1 | * | 6/2015 | Griffin | G01R 31/006 |
| 2015/0015234 A1 | * | 1/2015 | Ayanegui | G01R 19/155 324/76.11 |
| 2016/0061888 A1 | * | 3/2016 | Chait | B25B 9/02 324/754.11 |

* cited by examiner

*Primary Examiner* — Noam Reisner
(74) *Attorney, Agent, or Firm* — Boudwin Intellectual Property; Daniel Boudwin

(57) ABSTRACT

A voltage testing system. The voltage testing system includes a pair of probes, each having a housing with a first end and a second end, wherein the pair of probes are electrically connected by a wire affixed to the first end of each of the pair of probes. A prong extends from the second end of the pair of probes, wherein a pin extends therethrough. The pin is electrically conductive, such that the pin is in communication with a fuse and a plurality of lights within the housing. The pin can be spring-biased such that a connection is formed between the fuse and the pin when the force is applied to the pin. The fuse can sever the electrical connection when a set current is transmitted through the fuse, such that a user is protected from excessive currents. The plurality of lights illuminate in response to receiving a preset voltage.

18 Claims, 2 Drawing Sheets

VOLTAGE TESTING SYSTEM

CROSS REFERENCE TO RELATED APPLICATIONS

This application claims the benefit of U.S. Provisional Application No. 62/552,858 filed on Aug. 31, 2017. The above identified patent application is herein incorporated by reference in its entirety to provide continuity of disclosure

BACKGROUND OF THE INVENTION

The present invention relates to voltage testing systems. More particularly, the present invention relates to voltage testing systems having an interrupt fuse therein to prevent injury to a user due to high voltage.

Many electricians and home owners must test the voltage in an electrical system before beginning any work on the system, in order to minimize the risk of severe injury due to electricity. If the system is not properly tested, individuals may suffer serious injury or death due to sufficiently high voltages within the system. Typical testing tools display whether a voltage is present, however these devices are incapable of confirming the complete absence of voltage in an electrical system. Therefore, a device capable of confirming the absence of voltage in an electrical system is needed.

In light of the devices disclosed in the known art, it is submitted that the present invention substantially diverges in design elements from the known art and consequently it is clear that there is a need in the art for an improvement to existing voltage testing systems. In this regard, the instant invention substantially fulfills these needs.

SUMMARY OF THE INVENTION

In view of the foregoing disadvantages inherent in the known types of voltage testing systems now present in the known art, the present invention provides a voltage testing system wherein the same can be utilized for providing convenience for the user when determining whether voltage currently exists within an electrical system.

The present system comprises a pair of probes, each having a housing with a first end and a second end, wherein the pair of probes are electrically connected by a wire affixed to the first end of each of the pair of probes. A prong extends from the second end of each of the pair of probes, each prong having a pin affixed thereto configured to conduct electricity therethrough. A fuse is disposed within the housing in electrical communication with the pin, wherein the fuse is configured to sever the electrical connection when a set current is transmitted therethrough. A plurality of lights are disposed in the housing, the plurality of lights in electrical communication with the pin, wherein the plurality of lights are configured to illuminate in response to a preset voltage being received. In some embodiments, the pin is selectively movable between an extended position and a retracted position, wherein a first contact disposed on a proximal end of the pin contacts a second contact extending from the fuse when in the retracted position. In another embodiment, the pin is spring-biased towards the extended position via a spring disposed within the housing. In other embodiments, each of the plurality of lights are configured to illuminate at distinct levels of received voltage. In yet another embodiment, the plurality of lights are configured to illuminate sequentially. In some embodiments, the housing further comprises a plurality of windows therethrough, each window in alignment with one of the plurality of lights. In another embodiment, the plurality of lights each comprise a different color. In other embodiments, the plurality of lights are configured to intermittently illuminate. In yet another embodiment, the prong comprises a uniform diameter less than that of the housing. In some embodiments, the second end tapers inwardly relative to the housing towards the prong. In another embodiment, a power source having a pair of recesses is configured to receive the prong therein, wherein the pair of recesses are in electrical communication with the power source. In other embodiments, the power source comprises a control thereon, the control configured to selectively activate and deactivate the power source. In yet another embodiment, the power source further comprises an indicator light thereon, the indicator light configured to illuminate when the power source is activated. In some embodiments, the housing comprises an electrically insulated material.

BRIEF DESCRIPTION OF THE DRAWINGS

Although the characteristic features of this invention will be particular pointed out in the claims, the invention itself and manner in which it may be made and used may be better understood after a review of the following description, taken in connection with the accompanying drawings wherein like numeral annotations are provided throughout.

DETAILED DESCRIPTION OF THE INVENTION

Figure 1:
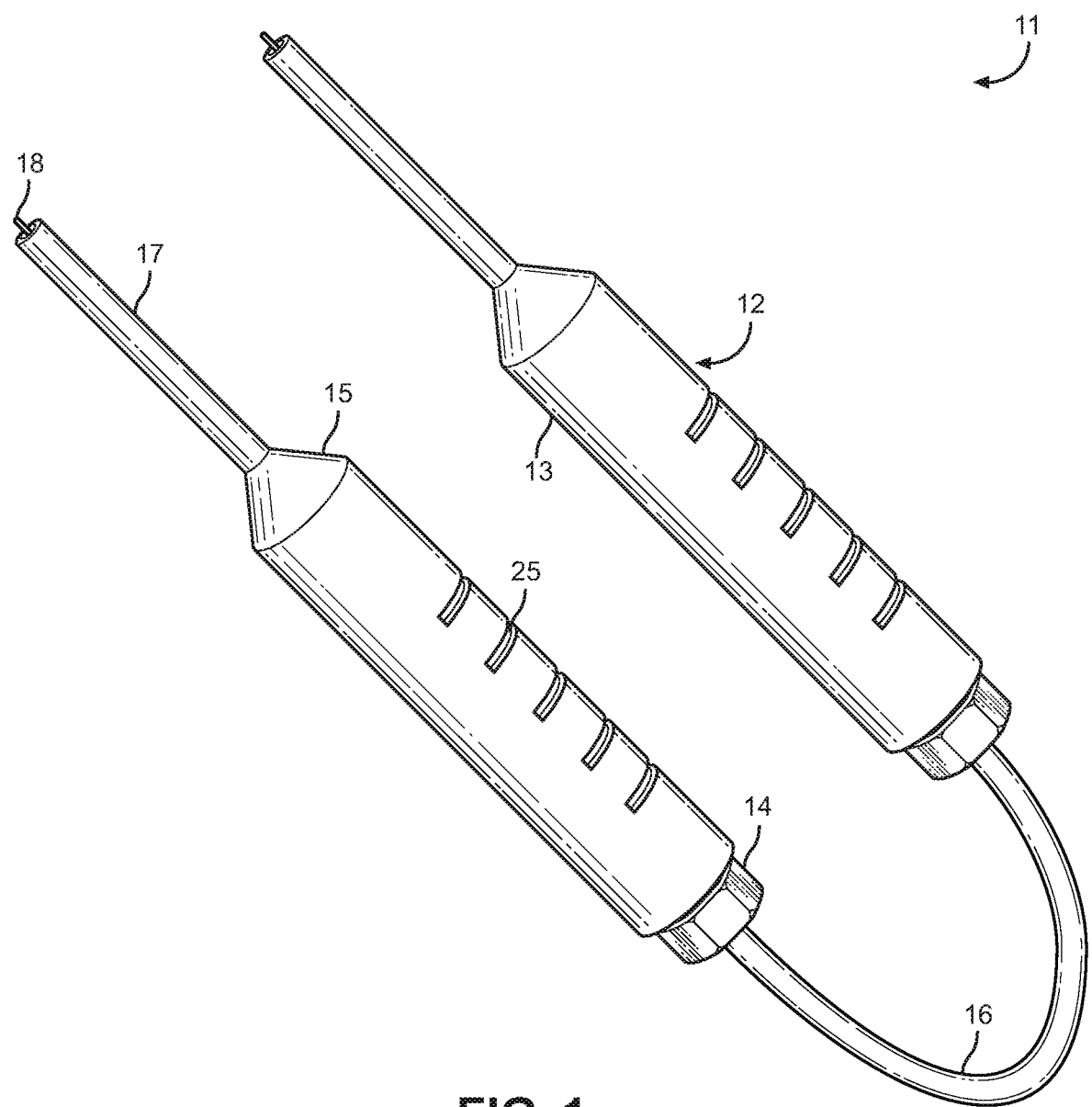
FIG. 1 shows a perspective view of an embodiment of the voltage testing system.

Reference is made herein to the attached drawings. Like reference numerals are used throughout the drawings to depict like or similar elements of the voltage testing system. The figures are intended for representative purposes only and should not be considered to be limiting in any respect.

Referring now to FIG. 1, there is shown a perspective view of an embodiment of the voltage testing system. The voltage testing system 11 comprises a pair of probes 12, each having a housing 13 comprising a first end 14 and a second end 15. A wire 16 extends between the first ends 14 of each of the pair of probes 12, such that the pair of probes 12 are electrically connected to each other. In this way, the user can complete a circuit between the pair of probes 12 to determine whether voltage is present in an electrical system. In the illustrated embodiment, the first end 14 further comprises a fastener thereon, the fastener configured to removably secure the wire 16 to the first end 14. Additionally, the fastener can be removed to provide access to an interior of the housing 13 to allow a user to replace any elements that have been damaged or otherwise perform maintenance on the pair of probes 12. In some embodiments, the housing 13 further comprises an electrically insulating material, such that the user is not exposed to any voltage transmitted therethrough. In an alternate embodiment, a gripping portion is disposed on the housing 13, the gripping portion comprising an insulating material. Additionally, in such embodiments, the gripping portion is configured to provide a secure gripping surface, thereby more efficiently frictionally engaging a user's hand than the housing 13 alone.

Figure 2:
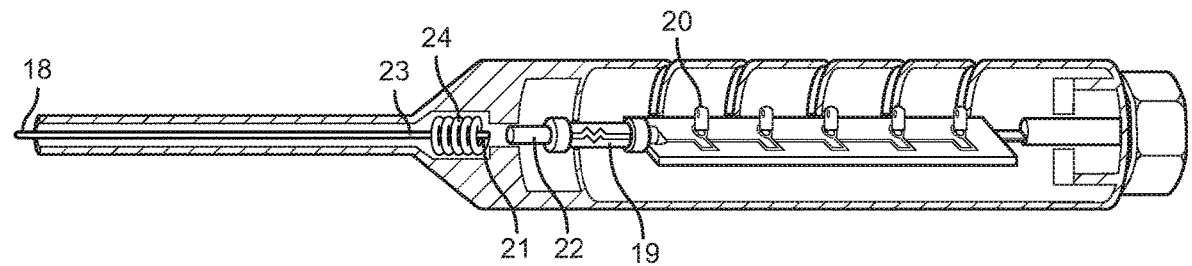
FIG. 2 shows a cross-sectional view of a probe of an embodiment of the voltage testing system.

In the illustrated embodiment, the housing 13 further comprises a plurality of windows 25 therein. The plurality of windows 25 are positioned along the housing 13 such that each of the windows 25 is aligned with one of a plurality of lights (as shown in FIG. 2, 20), thereby allowing a user to visually inspect whether the plurality of lights are illuminated to indicate the presence of voltage in an electrical system. In other embodiments, each of the plurality of windows 25 comprises indicia thereon, the indicia configured to indicate an amount of voltage present in an electrical system when a corresponding light of the plurality of lights is illuminated. In one exemplary use, the user can determine the amount of voltage present in the system by observing which of the plurality of windows 25 shows illumination therethrough, as each of the windows 25 corresponds to a different voltage level present in the electrical system.

The voltage testing system 11 further comprises a prong 17 extending from the second end 15 of the pair of probes 12. The prong 17 further comprises a pin 18 affixed therein, wherein the pin 18 is configured to conduct electricity therethrough. In the illustrated embodiment, the prong 17 comprises a diameter less than that of the housing 13, such that the user can easily insert the prong 17 within tight confines as typically encountered in electrical boxes and systems. In the illustrated embodiment, the second end 15 tapers inwardly relative to the housing 13 towards the prong 17, gradually decreasing the diameter of the second end 15 to meet the diameter of the prong 17, such that the prong 17 may be more easily maneuvered within electrical systems.

Referring now to FIG. 2, there is shown a cross-sectional view of a probe of an embodiment of the voltage testing system. In the illustrated embodiment, the pin 18 is selectively movable between an extended position and a retracted position, wherein the pin 18 completes a circuit hen in the retracted position. In the shown embodiment, the pin 18 is spring-biased towards the extended position via a spring 24 disposed within the housing. In this way, the pin 18 remains in the extended position and is readily available when a user makes use of the voltage testing system. When in the retracted position, a first contact 21 disposed on a proximal end 23 of the pin 18 contacts a second contact 22 extending from a fuse 19 disposed within the housing. When the first contact 21 and the second contact 22 meet, the circuit between the pin 18 and the fuse 19 is closed, thereby transferring current through the voltage testing system. In this way, the first contact 21 and the second contact 22 define an arc chamber thereabout, such that any sparks or arcing electricity from the connection of the first and second contacts 21, 22 occur entirely within the sealed arc chamber within the housing. This minimizes the risk of arcing current causing an explosion in explosive atmospheres, such as classified gas areas. The fuse 19 is thus in electrical communication with the pin 18, wherein the fuse 19 is configured to sever the electrical connection therebetween when exposed to a current in excess of a set current amount. The set current amount is variable based upon the rating of the fuse 19 placed within the housing. In this way, the user is protected from excessive current should the electrical system being tested still have dangerous levels of current therein.

The fuse 19 is then in electrical communication with the plurality of lights 20. The plurality of lights 20 are configured to illuminate when exposed to a set voltage to indicate the presence of that voltage. Alternatively, the plurality of lights 20 can be configured to intermittently illuminate or flash at a desired frequency, thereby increasing the visibility of the plurality of lights. In this way, a user is more readily informed of potentially dangerous levels of voltage in the electrical system. In some embodiments, the plurality of lights 20 are configured to illuminate sequentially as increasing levels of voltage are received, such that a user can determine the approximate amount of voltage present in an electrical system being tested. In other embodiments, each of the plurality of lights 20 comprises a different color, each color representing a different voltage level present in the electrical system.

Figure 3:
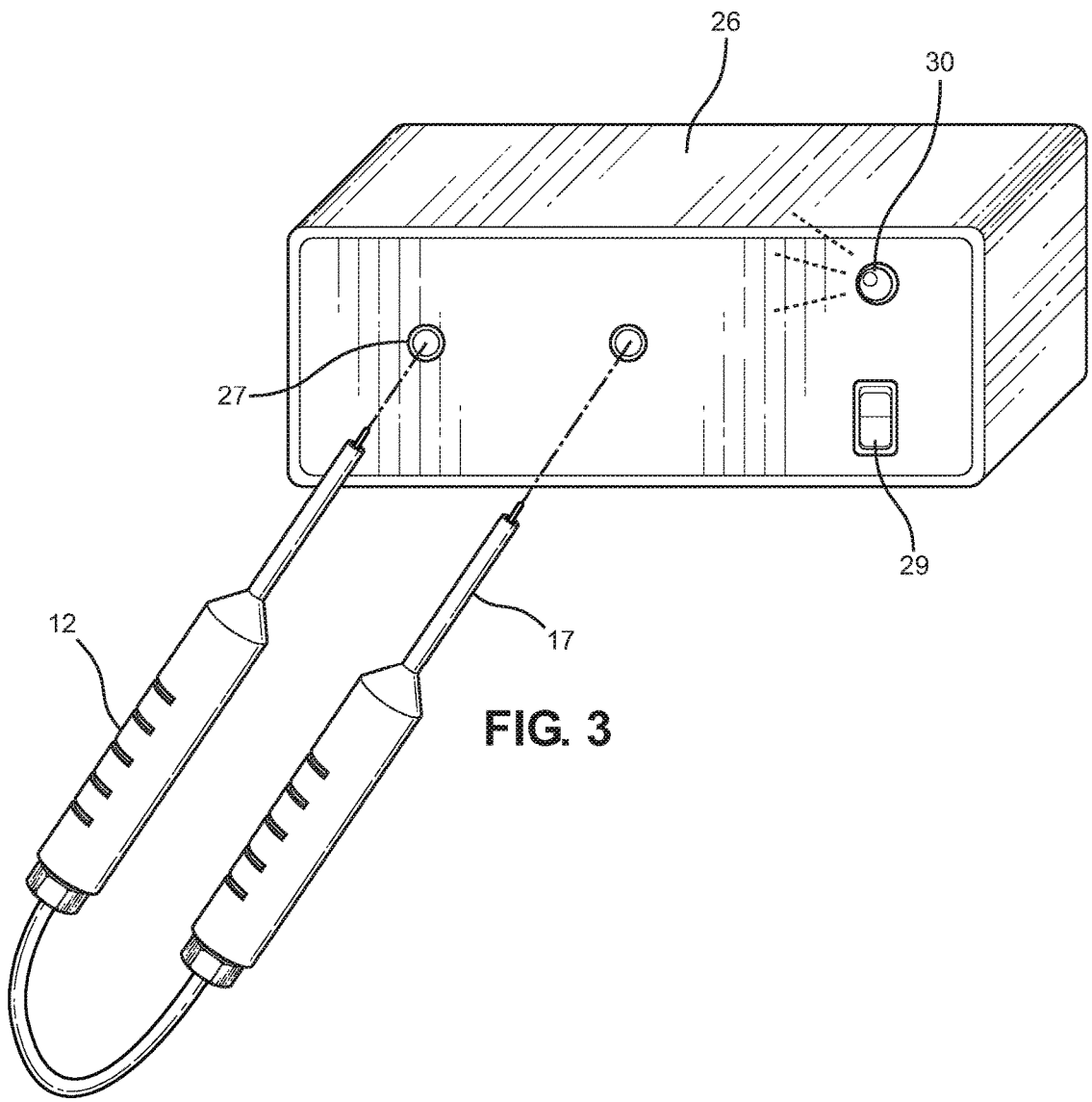
FIG. 3 shows a perspective view of an embodiment of the voltage testing system with an external power source.

Referring now to FIG. 3, there is shown a perspective view of an embodiment of the voltage testing system with an external power source. In the illustrated embodiment, the voltage testing system further comprises a power source 26 external to the pair of probes 12. The power source 26 comprises a pair of recesses 27 therein for receiving the prong 17 of the pair of probes 12 therein. The pair of recesses 27 are in electrical communication with the power source 26 such that when the prongs 17 are inserted therein, voltage is transmitted through the pair of probes 12. In this way, the power source 26 can be used to test the pair of probes 12 before testing on an existing electrical system to ensure that the pair of probes 12 are functioning correctly.

In the illustrated embodiment, the power source 26 further comprises a control 29 thereon, the control 29 configured to selectively activate and deactivate the power source 26, such that a user can sever the electrical connection between the pair of recesses 27 and the power source 26. In the illustrated embodiment, the control 29 comprises a two-way switch, such as a rocker switch or toggle. Alternatively, in other embodiments, the control 29 can comprise a dial or variable control, such that the control 29 can be configured to vary the amount of voltage transmitted to the pair of recesses 27, thereby allowing the user to calibrate the pair of probes 12. In the illustrated embodiment, the power source 26 further comprises an indicator light 30, the indicator light 30 configured to illuminate when the power source 26 is in the active state, allowing a user to determine that voltage is being transmitted to the pair of recesses 27.

In one exemplary use, the user takes the pair of probes 12 and inserts the prongs 17 into the pair of recesses 27 of the power source 26 to determine whether the pair of probes 12 are accurately detecting the presence of voltage. After testing, the user can then place the prongs 17 within the terminals of an existing electrical system, thereby completing a circuit between the two terminals with the pair of probes 12. Should voltage be present in the system, the plurality of lights will illuminate. In some embodiments, the user can determine the amount of voltage still present in the electrical system by observing which of the plurality of lights are illuminated, as each light indicates a different level of voltage. Additionally, should the current present within the electrical terminal be at unsafe levels, the fuse within the pair of probes 12 is configured to sever the electrical connection, thereby protecting the user from dangerous levels of current.

It is therefore submitted that the instant invention has been shown and described in various embodiments. It is recognized, however, that departures may be made within the scope of the invention and that obvious modifications will occur to a person skilled in the art. With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A voltage testing system, comprising:
a pair of probes, each comprising an identical housing having a first end and a second end;
wherein the pair of probes are electrically connected by a wire affixed to the first end of each of the pair of probes;
a prong extending from the second end of each of the pair of probes;
wherein a pin is affixed to each prong, the pin configured to conduct electricity therethrough;
a fuse in electrical communication with the pin, wherein the fuse is configured to sever the electrical connection when a set current is transmitted therethrough;
a plurality of lights disposed within each housing, the plurality of lights in electrical communication with each pin;
wherein the plurality of lights are configured to illuminate at a preset voltage.

2. The voltage testing system of claim 1, wherein the pin is selectively movable between an extended position and a retracted position, wherein a first contact disposed on a proximal end of the pin contacts a second contact extending from the fuse when in the retracted position.

3. The voltage testing system of claim 2, wherein the pin is spring-biased towards the extended position via a spring disposed within the housing.

4. The voltage testing system of claim 1, wherein each of the plurality of lights are configured to illuminate at distinct levels of received voltage.

5. The voltage testing system of claim 4, wherein the plurality of lights are configured to illuminate sequentially.

6. The voltage testing system of claim 1, wherein the housing further comprises a plurality of windows therethrough, each window in alignment with one of the plurality of lights.

7. The voltage testing system of claim 1, wherein the plurality of lights each comprise a different color.

8. The voltage testing system of claim 1, wherein the plurality of lights are configured to intermittently illuminate.

9. The voltage testing system of claim 1, wherein the prong comprises a uniform diameter less than that of the housing.

10. The voltage testing system of claim 9, wherein the second end tapers inwardly relative to the housing towards the prong.

11. The voltage testing system of claim 1, further comprising a power source having a pair of recesses configured to receive the prong therein, wherein the pair of recesses are in electrical communication with the power source.

12. The voltage testing system of claim 11, wherein the power source comprises a control therein, the control configured to selectively activate and deactivate the power source.

13. The voltage testing system of claim 11, wherein the power source further comprises an indicator light thereon, the indicator light configured to illuminate when the power source is activated.

14. The voltage testing system of claim 1, wherein the housing comprises an electrically insulated material.

15. The voltage testing system of claim 1, further comprising a fastener disposed on the first end of each housing, wherein the fastener is configured to removably secure the wire to the first end.

16. The voltage testing system of claim 15, wherein the fastener is configured to removably secure to the first end, such that, when removed, an interior volume of the housing is exposed thereby.

17. The voltage testing system of claim 2, wherein the first contact and the second contact are disposed within an arc chamber defined within the housing, wherein the arc chamber is electrically sealed to prevent electrical arcs between the first and second contacts from exiting the arc chamber.

18. The voltage testing system of claim 1, wherein the fuse is interchangeable with a plurality of fuses having various ratings.

* * * * *